United States Patent
Kurosawa

(10) Patent No.: US 11,815,925 B2
(45) Date of Patent: Nov. 14, 2023

(54) POWER SOURCE CIRCUIT, INPUT AND OUTPUT CIRCUIT, SEMICONDUCTOR STORAGE DEVICE, AND POWER SUPPLY CONTROL METHOD

(71) Applicant: KIOXIA CORPORATION, Tokyo (JP)

(72) Inventor: Tomonori Kurosawa, Zama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/461,852

(22) Filed: Aug. 30, 2021

(65) Prior Publication Data

US 2022/0269295 A1   Aug. 25, 2022

(30) Foreign Application Priority Data

Feb. 25, 2021   (JP) .................................. 2021-029004

(51) Int. Cl.
| | |
|---|---|
| *G05F 1/40* | (2006.01) |
| *G05F 1/575* | (2006.01) |
| *G11C 16/30* | (2006.01) |
| *G06F 13/16* | (2006.01) |
| *G06F 1/28* | (2006.01) |
| *G06F 13/40* | (2006.01) |
| *G11C 16/04* | (2006.01) |

(52) U.S. Cl.
CPC ................ *G05F 1/575* (2013.01); *G06F 1/28* (2013.01); *G06F 13/1668* (2013.01); *G06F 13/4022* (2013.01); *G11C 16/30* (2013.01); *G11C 16/0483* (2013.01)

(58) Field of Classification Search
CPC ............ G05F 1/575; G06F 1/28; G11C 16/30
See application file for complete search history.

(56) References Cited

U.S. PATENT DOCUMENTS

| | | | |
|---|---|---|---|
| 8,625,378 B2 | 1/2014 | Fukuda | |
| 2002/0024059 A1* | 2/2002 | Hidaka ..................... | G11C 8/08 |
| | | | 257/189 |
| 2019/0244672 A1* | 8/2019 | Okayama ............... | G11C 16/30 |
| 2020/0090765 A1* | 3/2020 | Rowley ..................... | G06F 1/28 |

FOREIGN PATENT DOCUMENTS

| | | |
|---|---|---|
| JP | 2011-108349 A | 6/2011 |
| JP | 2012-234601 A | 11/2012 |

\* cited by examiner

*Primary Examiner* — Farley Abad
*Assistant Examiner* — Ronald T Modo
(74) *Attorney, Agent, or Firm* — Kim & Stewart LLP

(57) ABSTRACT

A power source circuit includes: a plurality of power supply circuits which are electrically connected to different positions in a power supply wiring through which power is supplied to a plurality of processing circuits, wherein each of the power supply circuits is configured to generate a power supply voltage with reference to an input reference voltage, and supply the power supply voltage to the power supply wiring; and a reference voltage supply circuit generate a plurality of reference voltages with different voltages and to each of the plurality of power supply circuits, supply one of the different reference voltages as the input reference voltage thereof.

12 Claims, 8 Drawing Sheets

POWER SOURCE CIRCUIT, INPUT AND OUTPUT CIRCUIT, SEMICONDUCTOR STORAGE DEVICE, AND POWER SUPPLY CONTROL METHOD

CROSS-REFERENCE TO RELATED APPLICATION

This application is based upon and claims the benefit of priority from Japanese Patent Application No. 2021-029004, filed Feb. 25, 2021, the entire contents of which are incorporated herein by reference.

FIELD

Embodiments described herein relate generally to a power source circuit, an input and output circuit, a semiconductor storage device, and a power supply control method.

BACKGROUND

A semiconductor storage device such as a NAND non-volatile memory (e.g., NAND-type flash memory) is three-dimensionally structured to meet the demand for miniaturization and large capacity. Also, in the NAND non-volatile memory, a memory cell transistor is configured not only as a Single Level Cell (SLC) capable of storing 1-bit (binary value) data but also as a Multi Level Cell (MLC) capable of storing 2-bit (4-value) data, a Triple Level Cell (TLC) capable of storing 3-bit (8-value) data, or a Quad Level Cell (QLC) capable of storing 4-bit (16-value) data.

The NAND-type non-volatile memory includes an input and output circuit for sending and receiving data to and from a memory controller. In recent years, as capacity of the NAND-type non-volatile memory has increased, a transmission rate of data sent and received between the NAND-type non-volatile memory and the memory controller has increased. Therefore, a load current has become large in the input and output circuit and problems such as deterioration in the reliability of power supply wiring, increase in R drop, occurrence of electromagnetic interference (EMI), and the like, are likely to occur.

DETAILED DESCRIPTION

Embodiments provide a power source circuit, an input and output circuit, a semiconductor storage device, and a power supply control method capable of enabling a stable power supply.

In general, according to one embodiment, there is provided a power source circuit which includes: a plurality of power supply circuits which are electrically connected to different positions in a power supply wiring through which power is supplied to a plurality of processing circuits, wherein each of the power supply circuits is configured to generate a power supply voltage with reference to an input reference voltage, and supply the power supply voltage to the power supply wiring; and a reference voltage supply circuit configured to generate a plurality of reference voltages with different voltages and to each of the plurality of power supply circuits, supply one of the different reference voltages as the input reference voltage thereof.

Hereinafter, an embodiment of the present disclosure will be described in detail with reference to the drawings.

A power source circuit in the present embodiment includes a reference voltage supply circuit which outputs a reference voltage and a power supply circuit which generates a power source voltage based on the reference voltage. This embodiment makes it possible to supply an individual optimum reference voltage to each of a plurality of power supply circuits. Consequently, it is possible to generate a desired output in each power supply circuit, and thus a stable power supply is achieved.

Configuration of Memory System

Figure 1:
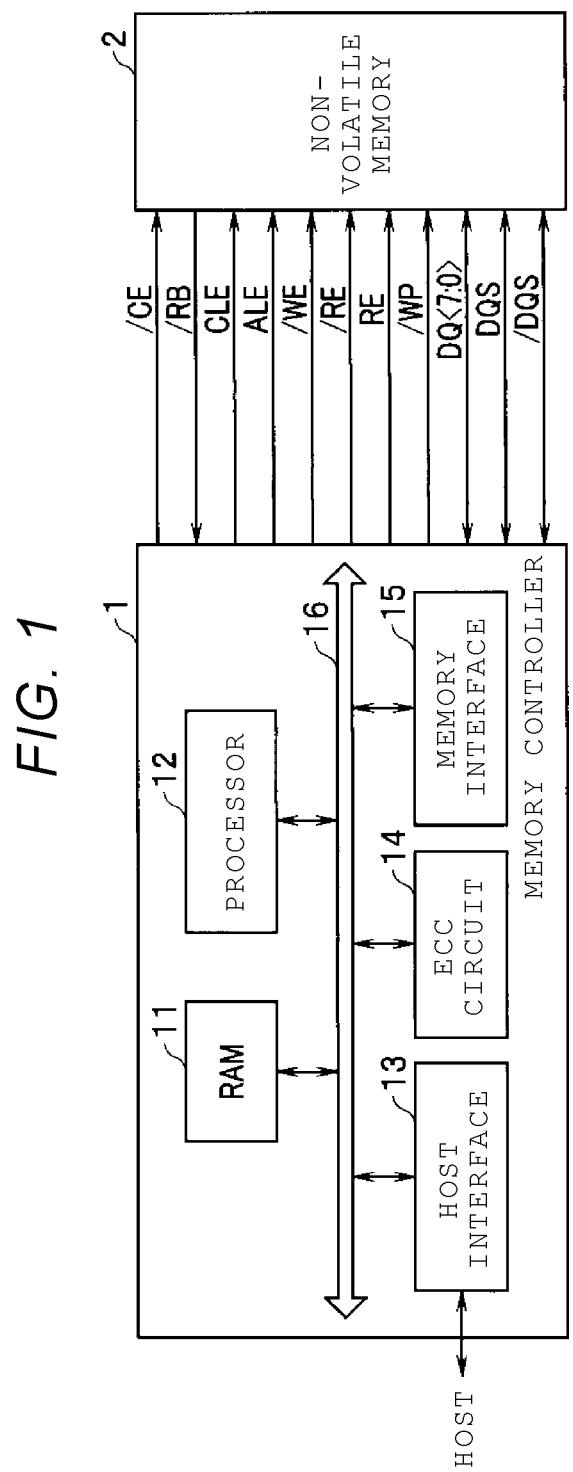
FIG. 1 is a block diagram illustrating a configuration example of a memory system according to an embodiment.

FIG. 1 is a block diagram illustrating a configuration example of a memory system according to the embodiment. The memory system of this embodiment includes a memory controller 1 and a NAND-type non-volatile memory 2. The NAND-type non-volatile memory is also simply referred to as a non-volatile memory. The memory system can be connected to a host (not illustrated). The host is, for example, an electronic device such as a personal computer or a mobile terminal.

The non-volatile memory 2 is a semiconductor storage device which stores data in a non-volatile manner. As illustrated in FIG. 1, the memory controller 1 and the non-volatile memory 2 (one or more of which may be provided) are connected via a NAND bus. The memory controller 1 controls writing of data to the non-volatile memory 2 according to a write request from the host. Further, the memory controller 1 controls reading of data from the non-volatile memory 2 in accordance with a read request from the host. The memory controller 1 includes a Random Access Memory (RAM) 11, a processor 12, a host interface circuit 13, an Error Check and Correct (ECC) circuit 14, and a memory interface circuit 15. The RAM 11, the processor 12, the host interface circuit 13, the ECC circuit 14, and the memory interface circuit 15 are connected to each other by an internal bus 16.

The host interface circuit 13 outputs a request and write data, which is user data, received from the host, and the like to the internal bus 16. Further, the host interface circuit 13 transmits the user data read from the non-volatile memory 2, the response from the processor 12, and the like to the host.

The memory interface circuit 15 controls a process of writing user data or the like to the non-volatile memory 2 and a process of reading data from the non-volatile memory 2 based on an instruction of the processor 12.

The processor 12 controls the memory controller 1. The processor 12 is, for example, a Central Processing Unit (CPU), a Micro Processing Unit (MPU), or the like. When the processor 12 receives a request from the host via the host interface circuit 13, the processor 12 performs control according to the request. For example, the processor 12 instructs the memory interface circuit 15 to write user data and parity to the non-volatile memory 2 in response to a request from the host. Further, the processor 12 instructs the memory interface circuit 15 to read the user data and the parity from the non-volatile memory 2 in response to the request from the host.

The processor 12 determines a storage area (hereinafter, referred to as a memory area) in the non-volatile memory 2 with respect to the user data stored in the RAM 11. The user data is stored in the RAM 11 via the internal bus 16. The processor 12 determines the memory area for a page of data (referred to herein as page data), which is a unit of writing. In this specification, user data stored in one page of the non-volatile memory 2 is defined as unit data. The unit data is encoded and stored in the non-volatile memory 2 as a code word, for example.

The ECC circuit 14 encodes the user data stored in the RAM 11 to generate a code word. Further, the ECC circuit 14 decodes the code word read from the non-volatile memory 2.

Encoding is optional. FIG. 1 illustrates a configuration in which encoding is performed as an example of the configuration. Alternatively, the memory controller 1 may store the unit data in the non-volatile memory 2 without encoding. When the memory controller 1 does not perform encoding, the page data matches the unit data. Further, one code word may be generated based on one unit data, or one code word may be generated based on divided data obtained by dividing the unit data. Further, one code word may be generated using a plurality of unit data.

The processor 12 determines the memory area of the non-volatile memory 2 to which data is to be written for each unit data. A physical address is assigned to the memory area of the non-volatile memory 2. The processor 12 manages the memory area to which the unit data is written by using the physical address. The processor 12 instructs the memory interface circuit 15 to write the user data to the non-volatile memory 2 by specifying the physical address of the determined memory area. The processor 12 manages correspondence between a logical address (e.g., logical address managed by the host) of the user data and a physical address. When the processor 12 receives a read request including a logical address from the host, the processor 12 identifies the physical address corresponding to the logical address, specifies the physical address, and instructs the memory interface circuit 15 to read the user data.

The RAM 11 temporarily stores the user data received from the host until it is stored in the non-volatile memory 2, or temporarily stores the data read from the non-volatile memory 2 until it is transmitted to the host. The RAM 11 is, for example, a general-purpose memory such as a Static Random Access Memory (SRAM) or a Dynamic Random Access Memory (DRAM).

FIG. 1 illustrates a configuration example in which the memory controller 1 includes the ECC circuit 14 and the memory interface circuit 15, respectively. However, the ECC circuit 14 may be built into the memory interface circuit 15. Further, the ECC circuit 14 may be built in the non-volatile memory 2.

When a write request is received from the host, the memory controller 1 operates as follows. The processor 12 temporarily stores the write data in the RAM 11. The processor 12 reads the data stored in the RAM 11 and inputs it to the ECC circuit 14. The ECC circuit 14 encodes the input data and outputs the code word to the memory interface circuit 15. The memory interface circuit 15 writes the input code word in the non-volatile memory 2.

When a read request is received from the host, the memory controller 1 operates as follows. The memory interface circuit 15 outputs the code word read from the non-volatile memory 2 to the ECC circuit 14. The ECC circuit 14 decodes the input code word and stores the decoded data in the RAM 11. The processor 12 transmits the data stored in the RAM 11 to the host via the host interface circuit 13.

The processor 12 of the memory controller 1 controls the memory interface circuit 15 to transmit a signal DQ<7:0> and data strobe signals DQS and /DQS to the non-volatile memory 2. The signal DQ<7:0> transmitted from the memory controller 1 to the non-volatile memory 2 includes a command, an address, and data. The data strobe signals DQS and /DQS are synchronization control signals indicating read and write timings generated in synchronization with data transfer.

The processor 12 controls the memory interface circuit 15 to transmit a chip enable signal /CE, a command latch enable signal CLE, an address latch enable signal ALE, a write enable signal /WE, read enable signals RE and /RE, and a write protect signal /WP to the non-volatile memory 2. The chip enable signal /CE is a signal for putting each non-volatile memory 2 into an operating state. The write enable signal /WE is a signal which permits writing into the non-volatile memory and the non-volatile memory 2 receives the write enable signal /WE to capture commands and addresses contained in the signal DQ<7:0>. That is, the write enable signal /WE may be called a capture signal. The command latch enable signal CLE is a signal which allows command latching and the address latch enable signal ALE is a signal which allows address latching.

A signal prefixed with a symbol "/" indicates active low or negative logic. That is, a signal without a leading symbol "/" is active at an "H" level, whereas a signal prefixed with the symbol "/" is activated at an "L" level.

On the other hand, the non-volatile memory 2 receives various signals from the memory controller 1 and transmits the signal DQ<7:0> and the data strobe signals DQS and /DQS to the memory controller 1. Further, the non-volatile memory 2 transmits a ready-busy signal R/B to the memory controller 1. The ready-busy signal R/B indicates whether the non-volatile memory 2 is in a ready state in which an external command can be accepted or a busy state in which an external command cannot be accepted.

Configuration of Non-Volatile Memory

Figure 2:
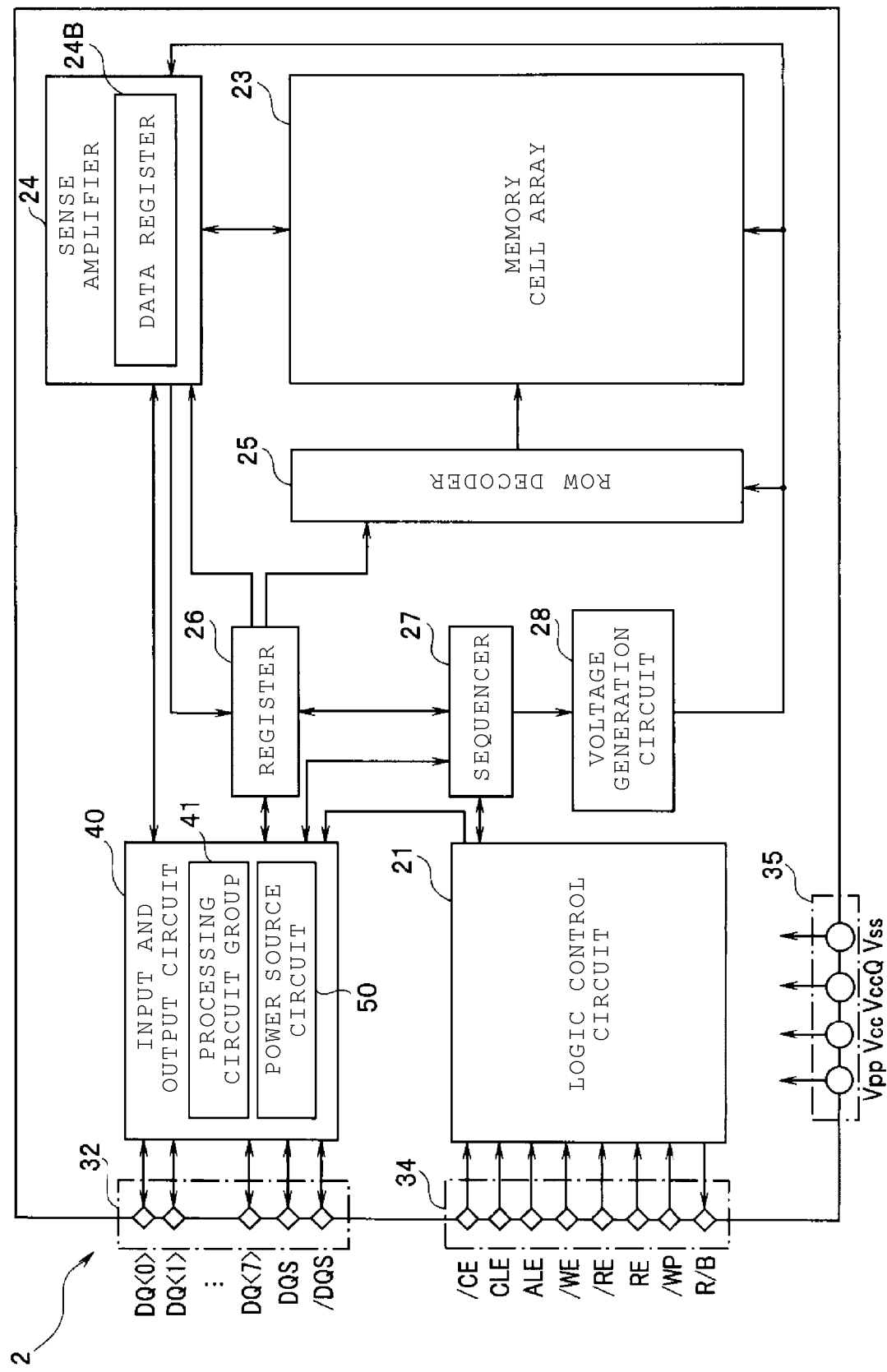
FIG. 2 is a block diagram illustrating a configuration example of a non-volatile memory.

FIG. 2 is a block diagram illustrating a configuration example of the non-volatile memory. The non-volatile memory 2 includes a logic control circuit 21, an input and output circuit 40, a memory cell array 23, a sense amplifier 24, a row decoder 25, a register 26, a sequencer 27, a voltage generation circuit 28, an input and output pad group 32, a logic control pad group 34, and a power source pad group 35.

In the non-volatile memory 2, various operating power sources, power supply voltages Vcc, VccQ, Vpp, and a ground voltage Vss are supplied from the outside via the power source pad group 35. The power supply voltage Vcc is a power supply voltage generally given from the outside as an operating power source and is, for example, a voltage of about 2.5 V. The power supply voltage VccQ is, for example, a voltage of 1.2 V. The power supply voltage VccQ is used when transmitting and receiving signals between the memory controller 1 and the non-volatile memory 2. The power supply voltage Vpp is a power supply voltage higher than the power supply voltage Vcc and is, for example, a voltage of 12 V.

The memory cell array 23 includes a plurality of blocks (also referred to as memory blocks). Each of the plurality of blocks BLK includes a plurality of memory cell transistors (also referred to as memory cells). A plurality of bit lines, a plurality of word lines, a source line, and the like are arranged in the memory cell array 23 in order to control a voltage applied to the memory cell transistor.

To send and receive each signal including data to and from the memory controller 1, the input and output pad group 32 includes a plurality of terminals (also referred to as pads) corresponding to the signal DQ<7:0> and the data strobe signals DQS and /DQS.

Since the logic control pad group 34 transmits and receives each signal to and from the memory controller 1, it includes a plurality of terminals (also referred to as pads) corresponding to the chip enable signal /CE, the command latch enable signal CLE, the address latch enable signal ALE, the write enable signal /WE, the read enable signals RE and /RE, and the write protect signal /WP.

The logic control circuit 21 is connected to the memory controller 1 via the NAND bus. The logic control circuit 21 receives an external control signal (for example, chip enable signal /CE, command latch enable signal CLE, address latch enable signal ALE, write enable signal /WE, read enable signals RE and /RE, and write protect signal /WP) from the memory controller 1 via the NAND bus. Further, the logic control circuit 21 transmits the ready busy signal R/B to the memory controller 1 via the NAND bus.

The input and output circuit 40 includes a processing circuit group 41 and a power source circuit 50. The processing circuit group 41 has a plurality of processing circuits (not illustrated) and these processing circuits perform various processes related to input and output by the input and output circuit 40. The power source circuit 50 supplies power to each processing circuit of the processing circuit group 41.

The input and output circuit 40 is controlled by the logic control circuit 21 and transmits and receives signals DQ (for example, DQ0 to DQ7) and signals DQS and /DQS to and from the memory controller 1 via the NAND bus.

The input and output circuit 40 is configured to receive the signal DQ as data in synchronization with the signals DQS and /DQS when the signal DQ is input together with the signals DQS and /DQS. Further, the input and output circuit 40 transmits the data read from the memory cell array 23 as the signal DQ to the memory controller 1 together with the signals DQS and /DQS in response to the signal RE input to the logic control circuit 21.

The input and output circuit 40 is controlled by the logic control circuit 21 to enable signal transfer corresponding to the signal /WE and signal transfer corresponding to the signals DQS and /DQS. The input and output circuit 40 is controlled by the logic control circuit 21 to select output paths of various received signals.

The logic control circuit 21 determines whether the signal transfer to the non-volatile memory 2 is specified by the memory controller 1. The logic control circuit 21 makes it possible to output a command received as the signal DQ to the register 26 in response to the signal CLE. The logic control circuit 21 makes it possible to output the address received as the signal DQ to the register 26 in response to the signal ALE. In synchronization with the signal /WE, the logic control circuit 21 outputs the signal received by the input and output circuit 40 to each unit to enable writing.

The input and output circuit 40 stores the command into the register 26 based on a signal supplied from the logic control circuit 21 when the signal CLE is activated and the input and output circuit 40 stores the address into the register 26 based on a signal supplied from the logic control circuit 21 when the signal ALE is activated. Further, the input and output circuit 40 transfers the write data to a data register 24B of the sense amplifier 24.

When the logic control circuit 21 receives the signal /WP, the logic control circuit 21 prohibits writing and erasing.

The register 26 stores the addresses and commands received by the input and output circuit 40 and output from the input and output circuit 40. The register 26 comprises, for example, an SRAM.

The sequencer 27 receives a command from the register 26 and controls non-volatile memory 2 according to a sequence based on this command. For example, the sequencer 27 controls the logic control circuit 21 based on an analysis result of the command. The logic control circuit 21 is configured to control the input and output circuit 40 according to this control.

The voltage generation circuit 28 is controlled by the sequencer 27, receives a power supply voltage from the outside of the non-volatile memory 2, and uses this power supply voltage to generate a plurality of voltages required for a write operation, a read operation, and an erasing operation. The voltage generation circuit 28 supplies the generated voltage to the memory cell array 23, the sense amplifier 24, the row decoder 25, and the like.

The row decoder 25 receives an address from the register 26 and decodes this address. The row decoder 25 performs a word line selection operation based on the decoded address. Then, the row decoder 25 transfers a plurality of voltages required for the write operation, the read operation, and the erasing operation to a selected block.

The sense amplifier 24 receives an address from the register 26 and decodes this address. The sense amplifier 24 selects one of bit lines based on the decoded address. Further, the sense amplifier 24 detects and amplifies the data read from the memory cell transistor into the bit line at the time of reading the data. Further, the sense amplifier 24 transfers the written data to the bit line at the time of writing the data.

The sense amplifier 24 includes the data register 24B, and the data register 24B stores the data detected by the sense amplifier 24 at the time of reading the data and serially transfers the data to the input and output circuit 40. Further, the data register 24B stores the data serially transferred from the input and output circuit 40 at the time of writing the data and transfers the data to the sense amplifier 24. The data register 24B comprises an SRAM and the like.

Problems

Figure 8:
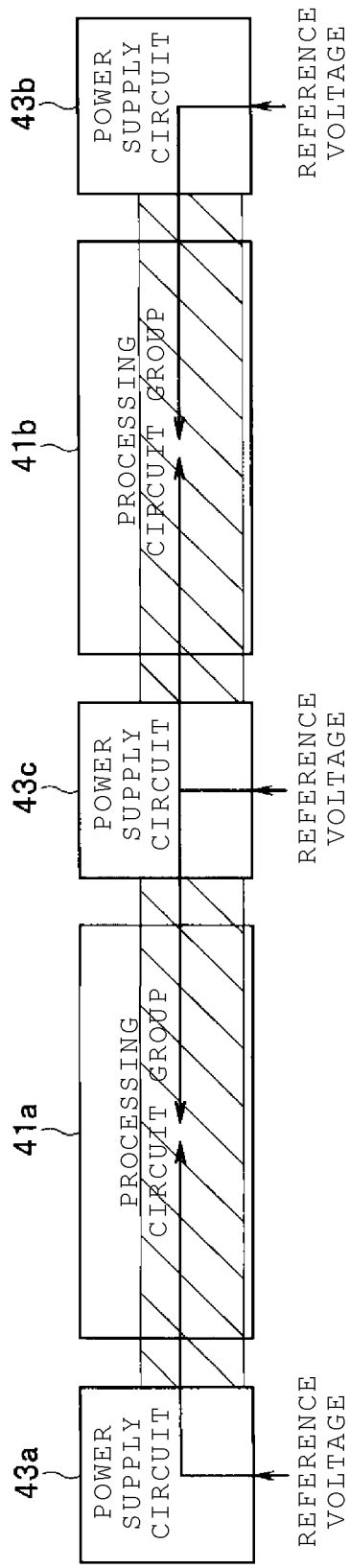
FIGS. 8 and 9 are diagrams for illustrating an arrangement of a plurality of power supply circuits in the input and output circuit and a problem when a plurality of power supply circuits are used.
Figure 9:
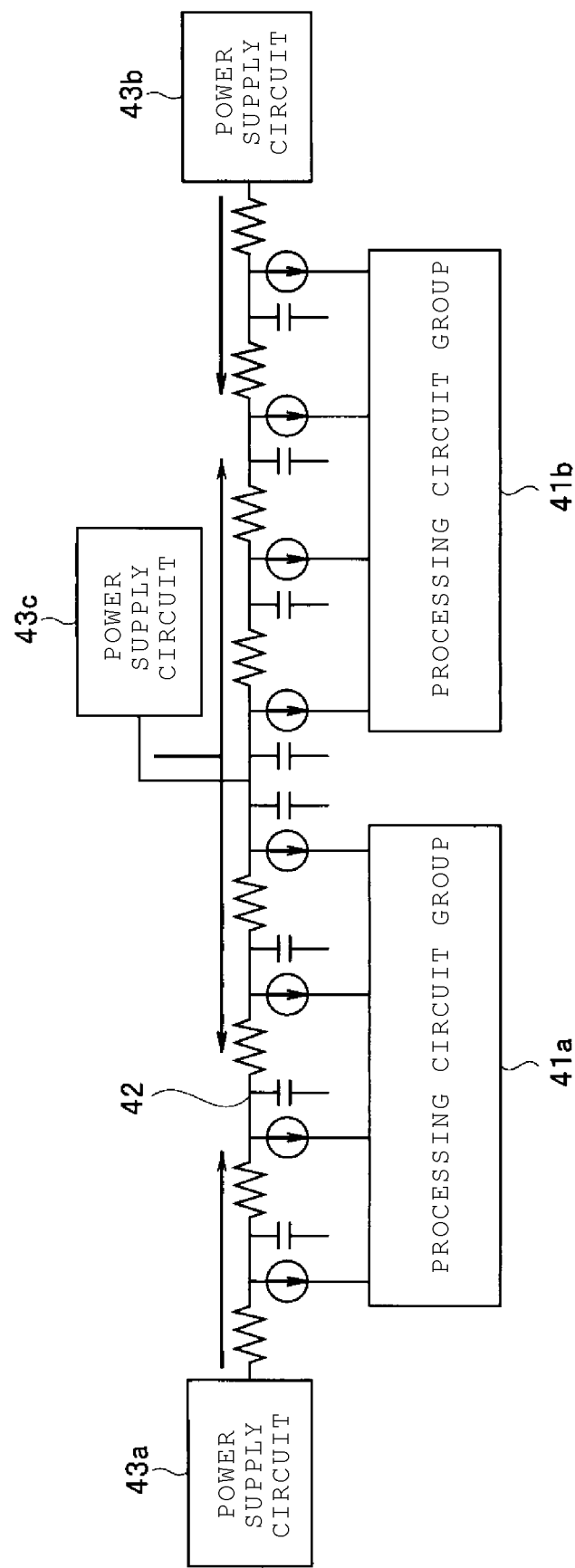

FIGS. 8 and 9 are explanatory diagrams for illustrating an arrangement of a plurality of power supply circuits in the input and output circuit 40 and a problem when a plurality of power supply circuits are used. FIG. 9 illustrates power supply wiring of FIG. 8 by resistors and capacitors. Further, in FIG. 9, the current supplied from the power supply wiring to each processing circuit is illustrated by a current source.

As a method of supplying power to the input and output circuit 40, a method of supplying power from one power supply circuit to all the processing circuits via the power supply wiring can be considered. In this case, it is necessary to extend the power supply line width and increase the supply current from the power supply circuit in consideration of high transmission speed, wiring reliability, IR drop, and the like. However, this method is not preferable in consideration of the necessity of EMI countermeasures and the like. Therefore, in the embodiment, a method of arranging a plurality of power supply circuits in the power supply wiring which supplies power to each processing circuit of the input and output circuit 40 is adopted. That is, a plurality of power supply circuits are provided in the input and output circuit 40 to disperse the current paths for performing supply to each processing circuit in the input and output circuit 40.

In FIGS. 8 and 9, processing circuit groups 41a and 41b (hereinafter, when it is not necessary to distinguish between them, they are collectively referred to as the processing circuit group 41) are provided in the input and output circuit and have a plurality of processing circuits (not illustrated) for performing input and output processing and the like. Power is supplied to each processing circuit in the processing circuit group 41 via a power supply wiring 42 (hatched portion). In the examples of FIGS. 8 and 9, power supply circuits 43a, 43b, and 43c (hereinafter, when it is not necessary to distinguish between them, they are collectively referred to as a power supply circuit 43) are arranged at both ends of the power supply wiring 42 and near a center position. The power supply circuits 43a to 43c are respectively electrically connected to both ends and the center of the power supply wiring 42. FIGS. 8 and 9 are examples and the arrangement positions and the number of arranged power supply circuits 43 may be appropriately set.

In the examples of FIGS. 8 and 9, as indicated by the arrows, current is supplied from the power supply circuits 43a and 43c to each processing circuit in the processing circuit group 41a in a part of the input and output circuit 40 via the power supply wiring 42. Further, current is supplied from the power supply circuits 43b and 43c to each of the processing circuits in the processing circuit group 41b configured in the other part of the input and output circuit 40 via the power supply wiring 42. By supplying drive current from a plurality of power supply circuits 43 to each processing circuit in the processing circuit group 41, it is also effective as an EMI countermeasure, and while maintaining high reliability of wiring, it is possible to supply sufficient power to each processing circuit without impairing an increase in transmission speed.

However, when the outputs of the plurality of power supply circuits 43 vary due to variations in device characteristics or the like, the characteristics of the input and output circuit 40 may deteriorate.

Each power supply circuit 43 generates a power supply voltage VDD supplied to the processing circuit. However, in reality, DC levels of voltages output from the power supply circuit 43 may differ from each other due to variations in the device characteristics. For example, the power supply circuits 43a and 43b may be configured to output a relatively high DC level voltage VDDH and the power supply circuit 43c may be configured to output a relatively low DC level voltage VDDL.

When the processing circuit operates by receiving power supply from the power supply circuit 43, the output voltage (load voltage) of the power supply circuit 43 may decrease. The power supply circuit 43 includes, for example, a voltage follower circuit, and when the output voltage drops, the power supply circuit 43 performs feedback control to cause the output voltage to follow the input voltage (e.g., reference voltage) to be increased, thereby the output voltage is returned to a specified value. In this case, the power supply circuits 43a and 43b which generate a high voltage VDDH increase the current supplied at a relatively early timing after the output voltage drops to return the output voltage to the original high voltage VDDH. On the other hand, in the power supply circuit 43c which generates a low voltage VDDL, since the originally generated voltage VDDL is low, the output voltage is returned to the original voltage by increasing the current supplied at a relatively late timing when the output voltage drops below the voltage VDDL. That is, the power supply circuit 43c has poorer responsiveness than the power supply circuits 43a and 43b. That is, originally, it is preferable to start increasing the current supply from all the power supply circuits 43 to each processing circuit at the same time, but due to variations in the power supply circuit 43, the current supply may become unbalanced depending on the position of the processing circuit and the characteristics of the input and output circuit 40 may deteriorate.

Configuration

Figure 3:
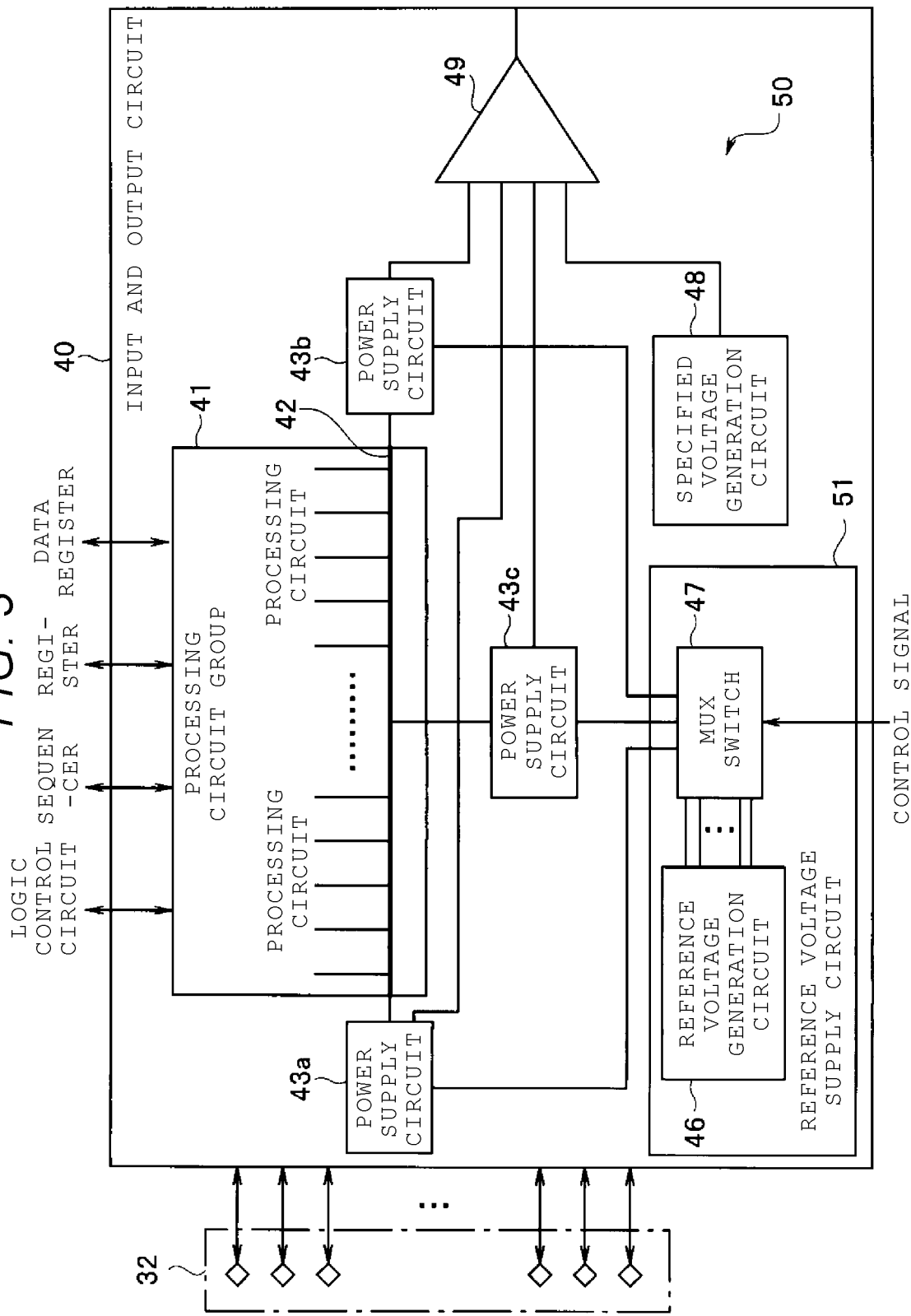
FIG. 3 is a block diagram illustrating an input and output circuit including a power source circuit according to the embodiment.

Therefore, in the embodiment, the power source circuit 50 illustrated in FIG. 3 is adopted. FIG. 3 is a block diagram illustrating the input and output circuit 40 provided with the power source circuit 50 according to the embodiment. The operation of the power source circuit 50 is controlled by the logic control circuit 21.

In FIG. 3, the input and output circuit 40 includes the processing circuit group 41 including a plurality of processing circuits (not illustrated). Each processing circuit in the processing circuit group 41 performs the above-described input and output control. Each processing circuit in the processing circuit group 41 receives power via the power supply wiring 42. The power supply circuits 43a and 43b are electrically connected to both ends of the power supply wiring 42 and the power supply circuit 43c is electrically connected near the center of the power supply wiring 42. For example, when the processing circuit group 41 has two processing circuit groups 41a and 41b, each processing circuit in the processing circuit group 41a is configured to receive power from the power supply circuits 43a and 43b and each processing circuit in the processing circuit group 41b is configured to receive power from the power supply circuits 43b and 43c. Reference voltages are individually supplied to these power supply circuits 43a to 43c from a reference voltage supply circuit 51 that includes a reference voltage generation circuit 46 and an MUX switch 47.

The reference voltage generation circuit 46 receives the power supply voltage VCC and generates a reference voltage corresponding to the power supply voltage VDD. In this embodiment, the reference voltage generation circuit 46 can generate a plurality of DC level reference voltages. A control signal is given to the MUX switch 47 from the logic control circuit 21. Based on the control signal, the MUX switch 47 selects a reference voltage suitable for each of the power supply circuits 43a to 43c from the plurality of DC level reference voltages generated in the reference voltage generation circuit 46 and supplies the reference voltage to the power supply circuits 43a to 43c.

The logic control circuit 21 controls the input and output circuit 40 by generating a control signal according to a set value of the MUX switch 47 obtained by a reference voltage determination process described below.

Figure 4:
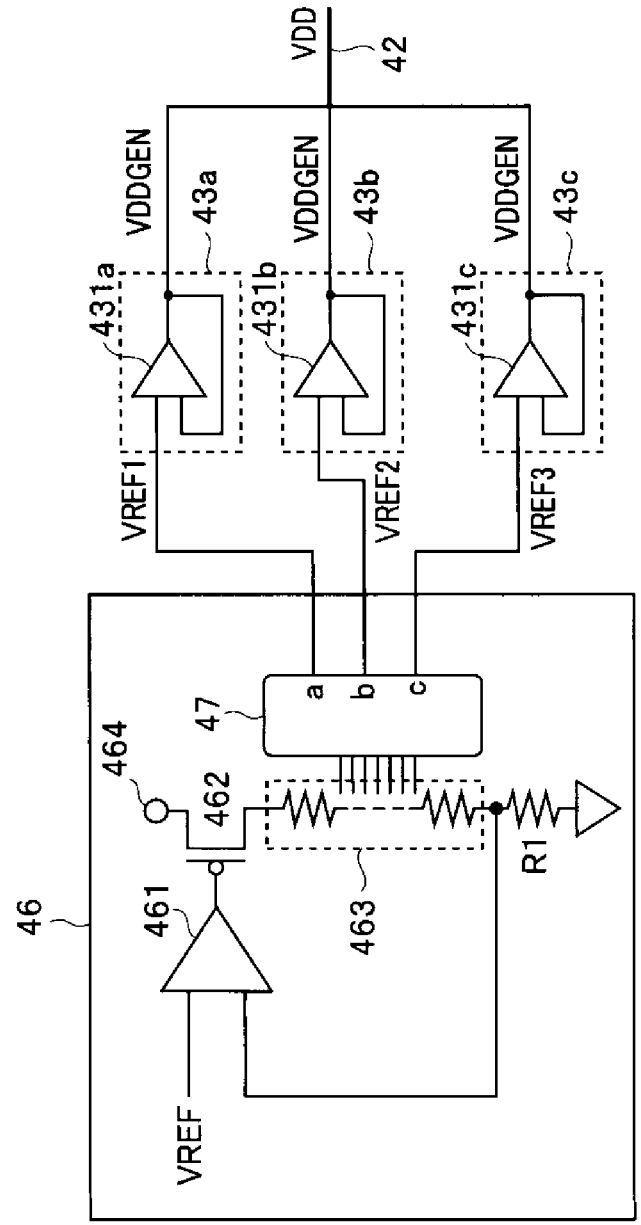
FIG. 4 is a circuit diagram illustrating an example of a specific configuration of a reference voltage generation circuit, a MUX switch, and power supply circuits in the input and output circuit of FIG. 3.

FIG. 4 is a circuit diagram illustrating an example of a specific configuration of the reference voltage generation circuit 46, the MUX switch 47, and the power supply circuits 43a to 43c in FIG. 3.

The reference voltage generation circuit 46 includes an operational amplifier 461, a P-type output transistor 462, and a resistance circuit 463. In the output transistor 462, a source is connected to a power supply terminal 464, an output of the operational amplifier 461 is applied to a gate, and a drain is connected to one end of the resistance circuit 463. The other end of the resistance circuit 463 is connected to a reference potential point via a resistor R1. The resistance circuit 463 includes, for example, a plurality of resistors connected in series.

The output transistor 462 generates a voltage at the drain corresponding to the output of the operational amplifier 461. The voltage (drain voltage) generated in the drain of the output transistor 462 is divided by the resistance circuit 463 and the resistor R1 and the voltage appearing at a connection point between the resistance circuit 463 and the resistor R1 is fed back to a positive input end of the operational amplifier 461. The operational amplifier 461 is provided with a reference voltage VREF for setting a reference voltage at a negative input end. The operational amplifier 461 outputs an output corresponding to a difference between the reference voltage VREF and the feedback voltage to the gate of the output transistor 462. The reference voltage VREF may be generated by, for example, the voltage generation circuit 28.

Due to this feedback loop, the drain voltage of the output transistor 462 converges to the voltage corresponding to the reference voltage VREF. The drain voltage of the output transistor 462 is divided by each resistor of the resistance circuit 463. In this way, a plurality of reference voltages at a level corresponding to the resistance value of each resistor are obtained at the plurality of resistance ends of the resistance circuit 463.

The MUX switch 47 includes a plurality of input terminals and a plurality of output terminals and determines an input terminal assigned to each of the plurality of output terminals based on a control signal. That is, the MUX switch 47 is configured to output the input taken in from the input terminal specified by the control signal via the output terminal assigned by the control signal.

In an example of FIG. 4, the MUX switch 47 has a plurality of input terminals connected to respective resistance ends of the resistance circuit 463 and can acquire a plurality of reference voltages having different levels from each other through the plurality of input terminals. The MUX switch 47 has output terminals a to c corresponding to the power supply circuits 43a to 43c, respectively, and the reference voltage acquired through the plurality of input terminals is supplied to the power supply circuits 43a to 43c via the output terminals a to c corresponding to the control signal. The MUX switch 47 can output one type of reference voltage acquired via one input terminal to the plurality of output terminals a to c. Thus, in this embodiment, from a plurality of types of reference voltages generated in the reference voltage generation circuit 46 with different levels, the reference voltage selected for each power supply circuit 43 by the MUX switch 47 is supplied to each power supply circuit 43.

The power supply circuits 43 have the same configuration as each other and may be implemented by, for example, an operational amplifier which forms a voltage follower. The three output terminals a to c of the MUX switch 47 are respectively connected to the positive input ends of the operational amplifiers 431a to 431c (hereinafter, when it is not necessary to distinguish between them, they are collectively referred to as the operational amplifier 431) forming the power supply circuits 43a to 43c. The output end of the operational amplifier 431 is connected to the negative input end. Three types of reference voltages VREF1, VREF2, and VREF3 output from the three output terminals a to c of the MUX switch 47 are respectively input to the positive input ends of the operational amplifiers 431a to 431c forming the power supply circuits 43a to 43c. The operational amplifiers 431a to 431c each output the voltage VDDGEN corresponding to the reference voltage input to the positive input end to the power supply wiring 42 as the power supply voltage VDD.

In the embodiment, as illustrated in FIG. 3, the power supply voltage from each power supply circuit 43 is also supplied to a comparison circuit 49 at the time of the reference voltage determination process described below. The comparison circuit 49 is also given a specified voltage from a specified voltage generation circuit 48. The specified voltage generation circuit 48 generates a voltage to be supplied as the power supply voltage VDD to the power supply wiring 42 as a specified voltage.

The comparison circuit 49 compares the power supply voltage from the power supply circuit 43 with the specified voltage and outputs a comparison result. The sequencer 27 determines whether the output voltage of the power supply circuit 43 is equal to (or within a specified range of) the specified voltage based on the comparison result from the comparison circuit 49. The sequencer 27 controls the logic control circuit 21 to change the set value of the MUX switch 47 so that the output voltage of the power supply circuit 43 becomes the specified voltage, thereby changing the reference voltages VREF1, VREF2, and VREF3 supplied to the operational amplifiers 431a to 431c. When the sequencer 27 determines from the comparison result of the comparison circuit 49 that the output voltage of the power supply circuit 43 is equal to (or within a specified range of) the specified voltage, that is, the voltage to be supplied to the power supply wiring 42, a set value of the MUX switch 47 set to generate the power supply voltage is determined and recorded for each power supply circuit 43.

Although FIG. 3 illustrates an example in which the specified voltage generation circuit 48 and the comparison circuit 49 are provided inside the power source circuit 50, these circuits may be provided outside the power source circuit 50. Further, although an example in which the reference voltage suitable for each power supply circuit 43 is selected from a plurality of reference voltages by the MUX switch 47 and supplied to each power supply circuit 43 is described, another method may be adopted. For example, by arranging three ladder resistors for three power supply circuits 43 in the reference voltage generation circuit 46, an individual reference voltage may be supplied to each power supply circuit 43, e.g., by setting the resistance value of each ladder resistor.

Operation

Figure 5:
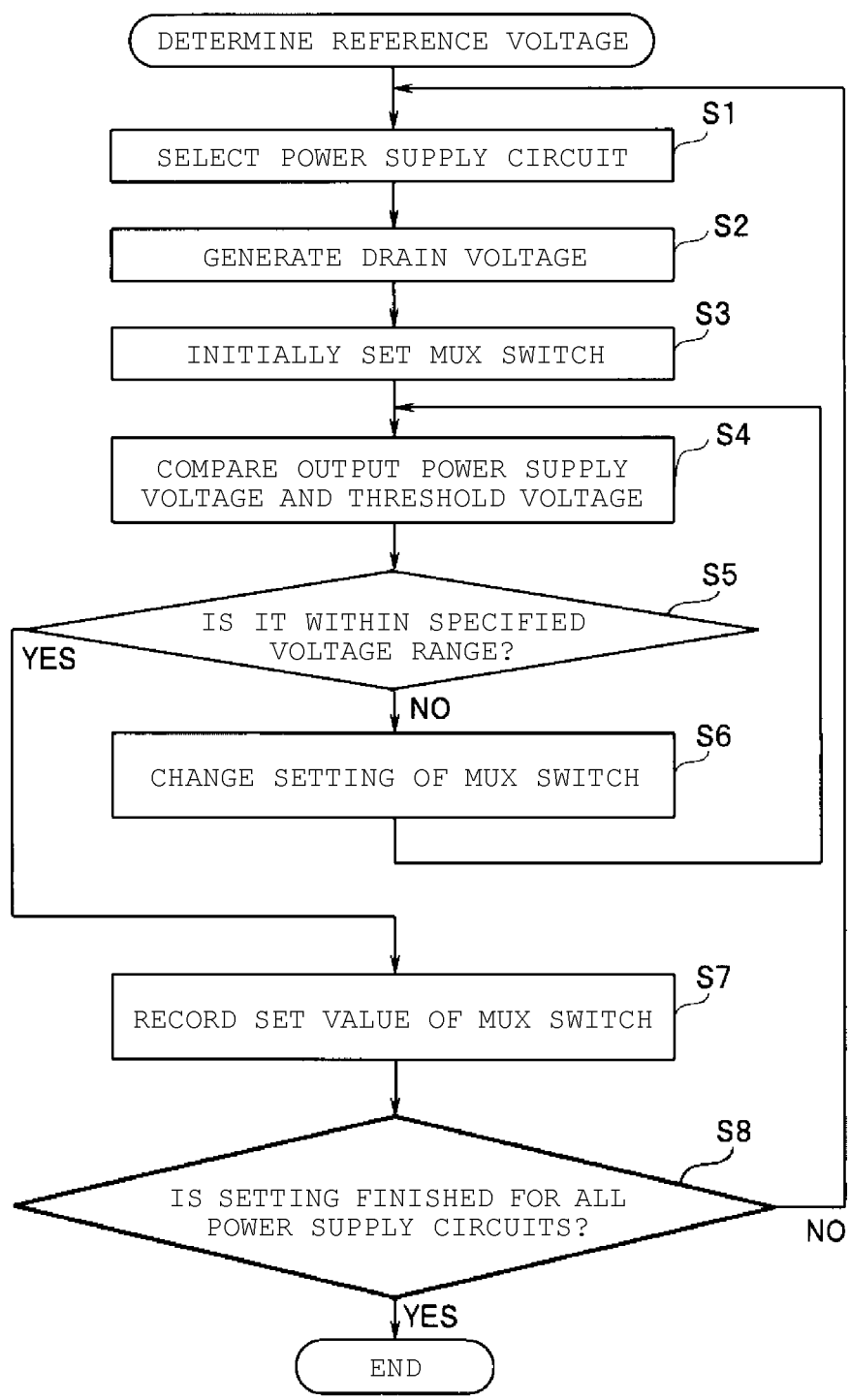
FIG. 5 is a flowchart for illustrating a reference voltage determination process.
Figure 6:
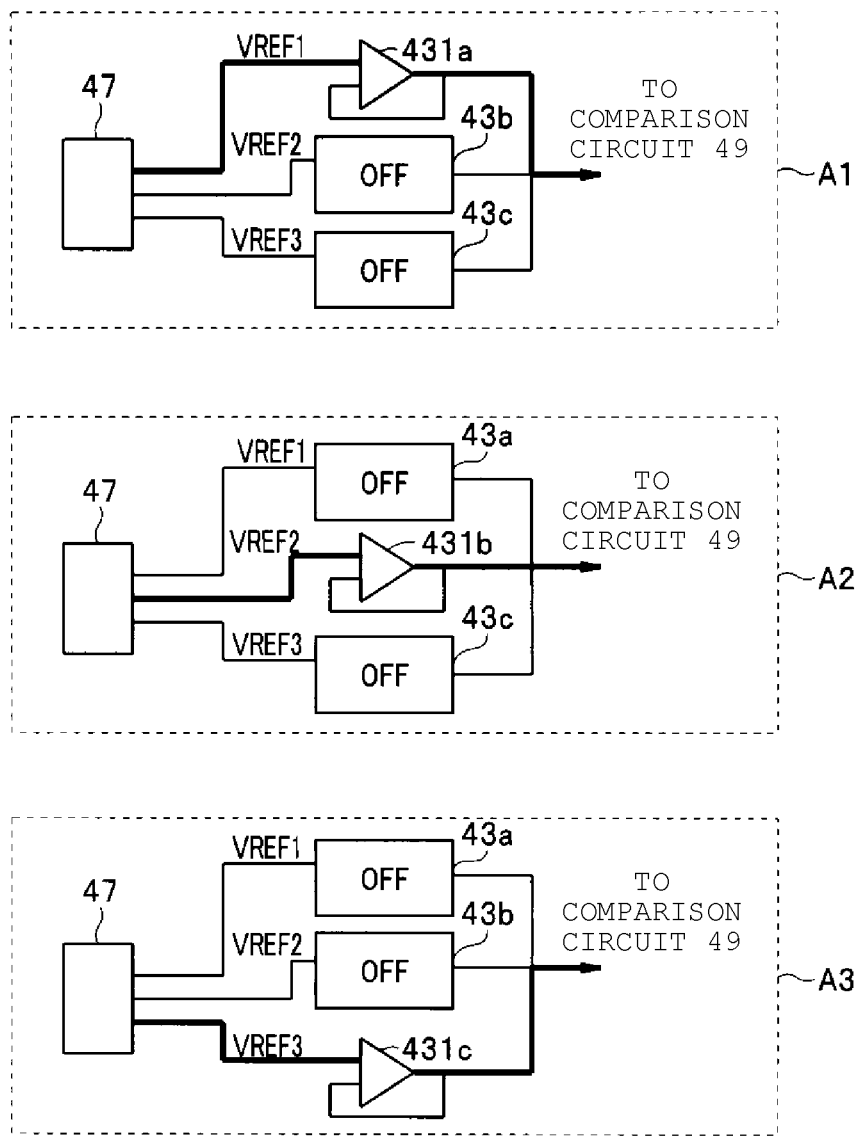
FIG. 6 is a diagram for illustrating the reference voltage determination process.
Figure 7:
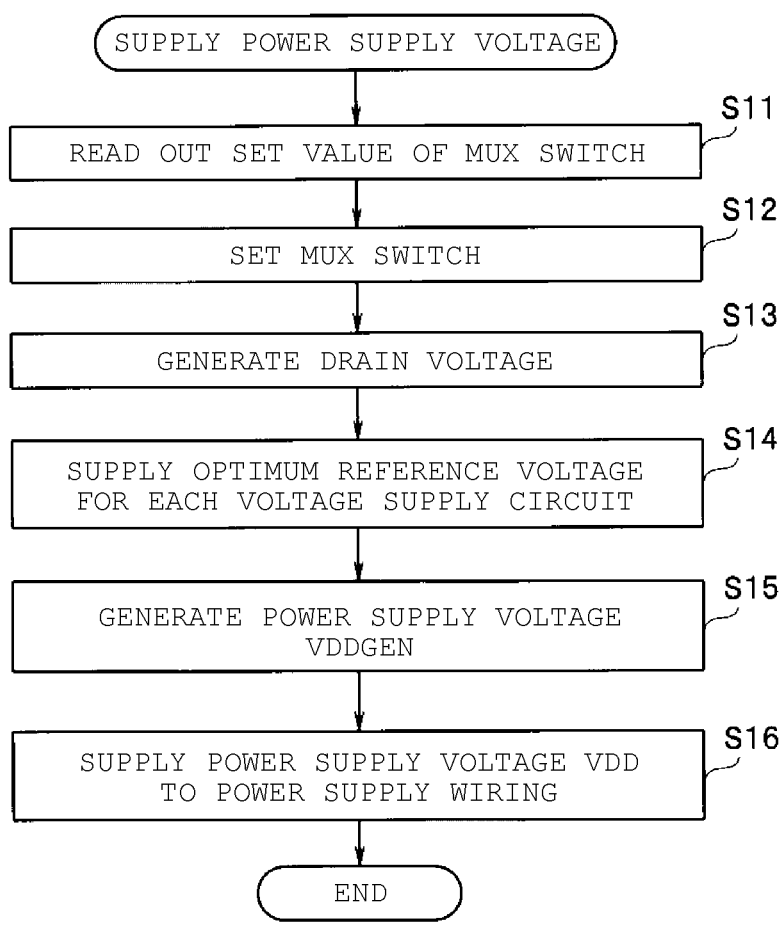
FIG. 7 is a flowchart for illustrating a power supply voltage generation process during actual use.

Next, an operation of the embodiment configured in this way will be described with reference to FIGS. 5 to 7. FIG. 5 is a flowchart for illustrating a reference voltage determination process and FIG. 6 is an explanatory diagram for illustrating the reference voltage determination process. Further, FIG. 7 is a flowchart for illustrating a process of generating the power supply voltage in actual use.

The reference voltage determination process of FIG. 5 may be performed, for example, before shipment from a factory. The sequencer 27 reads and executes a program for the reference voltage determination process. The sequencer 27 controls the logic control circuit 21 to perform each step of FIG. 5. The logic control circuit 21 selects and operates one of the power supply circuits 43 in Step S1. Now, for example, it is assumed that the logic control circuit 21 selectively operates the power supply circuit 43a. In such a case, as illustrated in a state A1 of FIG. 6, the non-selected power supply circuits 43b and 43c stop operating (are OFF) and do not output the power supply voltages from their output ends.

The logic control circuit 21 operates the reference voltage generation circuit 46 and generates a drain voltage from the output transistor 462 of the reference voltage generation circuit 46 (S2). This drain voltage is divided by the resistance circuit 463 and reference voltages having different voltage values are generated at the plurality of resistance ends of the resistance circuit 463.

The logic control circuit 21 operates the MUX switch 47 by default. That is, the logic control circuit 21 gives a control signal to the MUX switch 47, and as an input terminal assigned to the output terminal a connected to the power supply circuit 43a, an initial setting input terminal, for example, an input terminal having the smallest reference voltage is selected (S3). In this way, the reference voltage VREF1 corresponding to the control signal is supplied to the power supply circuit 43a. The power supply circuit 43a outputs a voltage corresponding to the input reference voltage VREF1 from the output terminal.

The output of the power supply circuit 43 is supplied to the power supply wiring 42, and the output of the power supply circuit 43 is also supplied to the comparison circuit 49 during a process of determining the reference voltage. The state A1 in FIG. 6 illustrates that the voltage generated by the power supply circuit 43a is supplied to the comparison circuit 49 by the thick line. In the state A1, as illustrated by the thick line in FIG. 6, only the operational amplifier 431a of the power supply circuit 43a operates and the generated voltage is supplied to the comparison circuit 49.

The comparison circuit 49 compares the voltage from the power supply circuit 43 with the specified voltage from the specified voltage generation circuit 48 and outputs a comparison result (S4). The sequencer 27 determines whether the output of the power supply circuit 43a is equal to (or within a specified range of) the specified voltage VDDGEN based on the comparison result. For example, the sequencer 27 may determine whether the comparison result from the comparison circuit 49 is within a predetermined threshold value, that is, whether the output voltage of the power supply circuit 43 is within the specified voltage range (S5). The voltage within the specified voltage range is the voltage within the specified range including the specified voltage.

When the comparison result is within a predetermined threshold value, the sequencer 27 determines that the voltage generated by the power supply circuit 43a is within acceptable range of the power supply voltage VDDGEN of a preset level and shifts the process to Step S7. When the sequencer 27 determines NO in Step S5, the sequencer 27 shifts the process to Step S6.

In Step S6, the logic control circuit 21 changes the setting of the MUX switch 47 by the control signal and the power supply circuit 43a is supplied with a reference voltage different from the previous one. The MUX switch 47 outputs the reference voltage acquired through the input terminal different from the previous one via the terminal a. The power supply circuit 43a outputs a voltage corresponding to the input voltage from the output terminal to the comparison circuit 49. The comparison circuit 49 compares the voltage from the power supply circuit 43a with the specified voltage from the specified voltage generation circuit 48 and outputs a comparison result (S4).

Then, the processes of Steps S4 to S6 are repeated until the comparison result of comparison circuit 49 is within a predetermined threshold value. When the sequencer 27 determines in Step S5 that the output of the power supply circuit 43a is within the specified voltage range, the sequencer 27 records a set value of the MUX switch 47 and associates the set value with the power supply circuit 43a. For example, the sequencer 27 may record the information of the set value of the MUX switch 47 in a management area (not illustrated) of the non-volatile memory 2.

Next, the sequencer 27 determines in Step S8 whether the set values of the MUX switch 47 for all the power supply circuits 43 are obtained. When the sequencer 27 determines NO in Step S8, the sequencer 27 shifts the process to Step S1 and selects the next power supply circuit 43. Then, as illustrated in a state A2 of FIG. 6, the set value of the MUX switch 47 when the specified voltage VDDGEN is obtained from the power supply circuit 43b is obtained and recorded by the processes of S1 to S8. This set value sets the input terminal which supplies the reference voltage to the terminal b of the MUX switch 47. Further, as illustrated in a state A3 of FIG. 6, the set value of the MUX switch 47 when the specified voltage VDDGEN is obtained from the power supply circuit 43c is obtained and recorded. This set value sets the input terminal which supplies the reference voltage to the terminal c of the MUX switch 47.

Next, an operation during actual use will be described.

When the power is turned on, the sequencer 27 reads and executes a program for supplying the power supply voltage. The sequencer 27 controls the logic control circuit 21 to perform each step of FIG. 7. In Step S11, the sequencer 27 reads out the set value of the MUX switch 47 recorded in the management area of the non-volatile memory 2. The sequencer 27 controls the logic control circuit 21 to set the read set value of the MUX switch 47 to the MUX switch 47 (S12). The logic control circuit 21 generates a control signal for setting the MUX switch 47 according to the read set value and gives it to the MUX switch 47 in the input and output circuit 40. As a result, input terminals for supplying a reference voltage are assigned to each of the output terminals a to c of the MUX switch 47. The MUX switch 47 can also assign the same input terminal to different output terminals.

The logic control circuit 21 operates the reference voltage generation circuit 46 and generates a drain voltage from the output transistor 462 of the reference voltage generation circuit 46 (S13). This drain voltage is divided by the resistance circuit 463 and reference voltages different from each other are generated at the plurality of resistance ends of the resistance circuit 463.

The MUX switch 47 supplies the reference voltages VREF1 to VREF3 acquired via the input terminals assigned to the output terminals a to c to the power supply circuits 43a to 43c via the output terminals a to c (S14). The power supply circuits 43a to 43c respectively generate the voltages VDDGEN according to the input reference voltages VREF1 to VREF3 (S15). The reference voltages VREF1 to VREF3 are obtained to output a common voltage VDDGEN from the power supply circuits 43a to 43c in the reference voltage determination process described above, and the voltages VDDGEN generated by the power supply circuits 43a to 43c are the same as each other. The power supply circuits 43a to 43c supply the generated voltage VDDGEN as the power supply voltage VDD to the power supply wiring 42 (S16).

In this way, the same power supply voltage VDD is supplied from the power supply circuits 43a to 43c to each processing circuit in the processing circuit group 41 via the power supply wiring 42. When each processing circuit in the processing circuit group 41 operates and the voltage of the power supply wiring 42 drops, the power supply circuits 43a to 43c cause the output voltages to follow the reference voltages VREF1 to VREF3 to be increased by feedback control. In this case, since the power supply circuits 43a to 43c are configured to generate the same voltage VDDGEN as the voltage corresponding to the reference voltages VREF1 to VREF3, the current supply from the power supply circuits 43a to 43c to the power supply wiring 42 by feedback control increases simultaneously and in a balanced manner. As a result, stable power is supplied from the plurality of power supply circuits 43 to each processing circuit in the processing circuit group 41, and thus each processing circuit can maintain stable operation.

As described above, in the embodiment, a plurality of reference voltages are generated and individual optimum reference voltages can be supplied to the plurality of power supply circuits. Therefore, regardless of the variation in device characteristics, it is possible to generate a desired output in each power supply circuit and a stable power supply can be achieved.

In the embodiment described above, an example in which an individual reference voltage can be supplied to the power supply circuit 43 by the reference voltage generation circuit 46 and the MUX switch 47 is described. However, for example, an individual reference voltage generation circuit may be provided for each power supply circuit 43 and the method of supplying an individual reference voltage to the power supply circuit 43 is not limited.

The present disclosure is not limited to the embodiment described above and may be modified at an implementation stage without departing from the gist thereof. In addition, various other embodiments may be provided by an appropriate combination of the components disclosed herein. For example, if the problem described herein can be solved and the effect described herein can be obtained, even when some of these components are removed, a configuration in which the components are removed may be considered an embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A power source circuit, comprising:
a plurality of power supply circuits which are electrically connected to different positions in a power supply wiring through which power is supplied to a plurality of processing circuits, wherein each of the power supply circuits is configured to:
generate a power supply voltage with reference to a corresponding input reference voltage, and
supply the same power supply voltage to the power supply wiring;
a reference voltage supply circuit configured to:
generate a plurality of reference voltages, and
supply, to each of the plurality of power supply circuits, a corresponding one of the reference voltages as the corresponding input reference voltage thereof; and
a plurality of reference voltage supply wirings, each of the plurality of reference voltage supply wirings connected between the reference voltage supply circuit and a corresponding one of the plurality of power supply circuits,
wherein the plurality of power supply circuits generate the same power supply voltage based on different input reference voltages supplied over the plurality of reference voltage supply wirings.

2. The power source circuit according to claim 1, wherein the reference voltage supply circuit includes:
a reference voltage generation circuit configured to generate the plurality of reference voltages, and
a switch which is controlled to selectively supply, to each of the reference voltage supply wirings, a corresponding one of the reference voltages.

3. The power source circuit according to claim 2, further comprising:
a memory for storing a set value of the switch; and
a control circuit which controls the switch based on the set value read from the memory.

4. The power source circuit according to claim 3, further comprising:
a comparison circuit configured to compare an output voltage of each of the power supply circuits with a target power supply voltage, wherein
the control circuit is configured to:
determine the set value of the switch based on comparison results of the comparison circuit, and
store the determined set value in the memory.

5. The power source circuit according to claim 2, wherein the switch includes a plurality of input terminals to each of which a different one of the reference voltages generated by the reference voltage generation circuit is supplied, and a plurality of output terminals to each of which a different one of the reference voltage supply wirings is connected, and
the switch is controlled to connect each of the output terminals to a corresponding one of the input terminals.

6. A semiconductor storage device, comprising:
an input and output circuit configured to send and receive data to and from an external memory controller, the input and output circuit comprising:
a plurality of processing circuits configured to control sending and receiving of the data to and from the external memory controller;
a plurality of power supply circuits which are electrically connected to different positions in a power supply wiring through which power is supplied to the plurality of processing circuits, wherein each of the power supply circuits is configured to:
generate a power supply voltage with reference to a corresponding input reference voltage, and
supply the same power supply voltage to the power supply wiring;
a reference voltage supply circuit configured to:
generate a plurality of reference voltages, and
supply, to each of the plurality of power supply circuits, a corresponding one of the reference voltages as the corresponding input reference voltage thereof; and
a plurality of reference voltage supply wirings, each of the plurality of reference voltage supply wirings connected between the reference voltage supply circuit and a corresponding one of the plurality of power supply circuits, wherein the plurality of power supply circuits generate the same power supply voltage based on different input reference voltages supplied over the plurality of reference voltage supply wirings; and a non-volatile memory in which data input via the input and output circuit are written, and from which data output via the input and output circuit are read.

7. The semiconductor storage device according to claim 6, wherein the reference voltage supply circuit includes:

a reference voltage generation circuit configured to generate the plurality of reference voltages, and a switch which is controlled to selectively supply to each of the reference voltage supply wirings, a corresponding one of the reference voltages.

8. The semiconductor storage device according to claim 7, further comprising:

a control circuit which controls the switch based on a set value of the switch that stored in the non-volatile memory.

9. The semiconductor storage device according to claim 8, further comprising:

a comparison circuit configured to compare an output voltage of each of the power supply circuits with a target power supply voltage, wherein the control circuit is configured to:

determine the set value of the switch based on comparison results of the comparison circuit, and store the determined set value in the non-volatile memory.

10. The semiconductor storage device according to claim 7, wherein the switch includes a plurality of input terminals to each of which a different one of the reference voltages generated by the reference voltage generation circuit is supplied, and a plurality of output terminals to each of which a different one of the reference voltage supply wirings is connected, and the switch is controlled to connect each of the output terminals to a corresponding one of the input terminals.

11. The semiconductor storage device according to claim 6, wherein the processing circuits include a first processing circuit that is connected to:

a first position of the power supply wiring to receive the same power supply voltage from a first power supply circuit of the power supply circuits, and a second position of the power supply wiring to receive the same power supply voltage from a second power supply circuit of the power supply circuits.

12. A method of controlling output voltages of power supply circuits of a semiconductor storage device, wherein the power supply circuits are electrically connected to different positions in a power supply wiring through which power is supplied to a plurality of processing circuits configured to control sending and receiving of data to and from an external memory controller, said method comprising:

generating, by a reference voltage supply circuit, a plurality of reference voltages, wherein the reference voltage supply circuit and the power supply circuits are connected via a respective one of a plurality of reference voltage supply wirings;

supplying, by the reference voltage supply circuit, to each of the power supply circuits, a corresponding one of the reference voltages as a corresponding input reference voltage with reference to which said each of the power supply circuits generates a corresponding output voltage that is supplied to the power supply wiring;

controlling a switch to selectively supply to each of the reference voltage supply wirings, a corresponding one of the reference voltages, wherein the switch includes a plurality of input terminals to each of which a different one of the reference voltages is supplied, and a plurality of output terminals to each of which a different one of the reference voltage supply wirings is connected, and the switch is controlled to connect each of the output terminals to a corresponding one of the input terminals; and retrieving a set value of the switch that is stored in a memory, wherein the switch is controlled according to the set value of the switch that is retrieved, wherein the output voltages generated by the power supply circuits are equal to each other.

* * * * *